(12) United States Patent
Urakawa

(10) Patent No.: US 9,224,616 B2
(45) Date of Patent: Dec. 29, 2015

(54) ETCHING METHOD AND PLASMA PROCESSING APPARATUS

(71) Applicant: Tokyo Electron Limited, Tokyo (JP)

(72) Inventor: Masafumi Urakawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/400,381

(22) PCT Filed: May 27, 2013

(86) PCT No.: PCT/JP2013/064650
§ 371 (c)(1),
(2) Date: Nov. 11, 2014

(87) PCT Pub. No.: WO2013/187219
PCT Pub. Date: Dec. 19, 2013

(65) Prior Publication Data
US 2015/0140828 A1   May 21, 2015

Related U.S. Application Data

(60) Provisional application No. 61/662,614, filed on Jun. 21, 2012.

(30) Foreign Application Priority Data

Jun. 12, 2012  (JP) ................................ 2012-132830

(51) Int. Cl.
| | |
|---|---|
| *H01L 21/308* | (2006.01) |
| *H01L 21/3065* | (2006.01) |
| *H01L 21/3213* | (2006.01) |
| *H01J 37/32* | (2006.01) |
| *H01L 21/67* | (2006.01) |

(52) U.S. Cl.
CPC ......... *H01L 21/3081* (2013.01); *H01J 37/3244* (2013.01); *H01J 37/32091* (2013.01);

(Continued)

(58) Field of Classification Search
USPC ................... 216/41, 47, 67, 79; 438/710, 717
See application file for complete search history.

(56) References Cited

U.S. PATENT DOCUMENTS

| | | |
|---|---|---|
| 5,298,790 A | 3/1994 | Harmon |
| 5,423,941 A | 6/1995 | Komura |

(Continued)

FOREIGN PATENT DOCUMENTS

| | | | |
|---|---|---|---|
| JP | 05-082636 A | 4/1993 | |
| JP | 06-163478 A | 6/1994 | |

(Continued)

OTHER PUBLICATIONS

Sugawara, Plasma Etching Fundamentals and Application, 1998, pp. 1-3.*

(Continued)

*Primary Examiner* — Shamim Ahmed
(74) *Attorney, Agent, or Firm* — Pearne & Gordon LLP

(57) ABSTRACT

A method of etching an etching target layer containing polycrystalline silicon includes preparing a target object including the etching target layer and a mask formed on the etching target layer; and etching the etching target layer with the mask. Further, the mask includes a first mask portion formed of polycrystalline silicon and a second mask portion interposed between the first mask portion and the etching target layer and formed of silicon oxide. Furthermore, in the etching of the etching target layer, a first gas for etching the etching target layer, a second gas for removing a deposit adhering to the mask, and a third gas for protecting the first mask portion are supplied into a processing vessel in which the target object is accommodated, and plasma of these gases is generated within the processing vessel.

5 Claims, 6 Drawing Sheets

(52) U.S. Cl.
CPC ..... *H01J 37/32165* (2013.01); *H01J 37/32449* (2013.01); *H01L 21/3065* (2013.01); *H01L 21/32137* (2013.01); *H01L 21/32139* (2013.01); *H01L 21/67069* (2013.01); *H01J 2237/334* (2013.01)

(56) References Cited

U.S. PATENT DOCUMENTS

2007/0207618 A1   9/2007  Une
2012/0309202 A1*  12/2012  Sasaki ........................... 438/703

FOREIGN PATENT DOCUMENTS

| JP | 2003-151960 A | 5/2003 |
|---|---|---|
| JP | 2007-234870 A | 9/2007 |
| JP | 4722725 A | 10/2009 |

OTHER PUBLICATIONS

International Search Report for PCT/JP2013/064650 dated Aug. 20, 2013.

* cited by examiner

FIG. 5

| | PRESSURE (Pa) | HF POWER (W) | LF POWER (W) | HBr (sccm) | NF$_3$ (sccm) | O$_2$ (sccm) |
|---|---|---|---|---|---|---|
| EXPERIMENTAL EXAMPLE 1 | 10.6 | 400 | 950 | 200 | 19 | 19 |
| EXPERIMENTAL EXAMPLE 2 | 10.6 | 400 | 950 | 200 | 38 | 48 |
| EXPERIMENTAL EXAMPLE 3 | 10.6 | 400 | 950 | 200 | 30 | 19 |
| EXPERIMENTAL EXAMPLE 4 | 10.6 | 400 | 950 | 200 | 38 | 38 |
| EXPERIMENTAL EXAMPLE 5 | 10.6 | 400 | 950 | 200 | 38 | 28 |
| EXPERIMENTAL EXAMPLE 6 | 10.6 | 400 | 950 | 200 | 38 | 19 |

ETCHING METHOD AND PLASMA PROCESSING APPARATUS

CROSS-REFERENCE TO RELATED APPLICATION

This Application is a U.S. national phase application under 35 U.S.C. §371 of PCT Application No. PCT/JP2013/064650 filed on May 27, 2013, which claims the benefit of Japanese Patent Application No. 2012-132830 filed on Jun. 12, 2012, and U.S. Provisional Application Ser. No. 61/662,614 filed on Jun. 21, 2012, the entire disclosures of which are incorporated herein by reference.

TECHNICAL FIELD

The embodiments described herein pertain generally to an etching method and a plasma processing apparatus, and more particularly, to a method of etching an etching target layer containing polycrystalline silicon and a plasma processing apparatus in which the etching method can be performed.

BACKGROUND

In a semiconductor device manufacturing process, an etching process is performed to various semiconductor layers. As one of such semiconductor layers, a polycrystalline silicon layer may be used. When a polycrystalline silicon layer as an etching target layer is etched, generally, a mask made of silicon oxide is formed on the etching target layer, and an etching process is performed to the etching target layer with the mask. Such an etching method is described in, for example, Patent Document 1.

To be more specific, in the etching method described in Patent Document 1, a silicon oxide layer is formed on the etching target layer which is a polycrystalline silicon layer, and a resist mask is formed on the silicon oxide layer. Then, the silicon oxide layer is etched using the resist mask, and, thus, a mask made of silicon oxide is formed. Then, the resist mask is removed. Thereafter, the etching target layer is etched with plasma of an etchant gas with the mask made of silicon oxide.

REFERENCES

Patent Document 1: Japanese Patent Publication No. 4722725

DISCLOSURE OF THE INVENTION

Problems to be Solved by the Invention

In recent years, with reduction in size of semiconductor devices, miniaturization in shape such as holes or grooves formed in an etching target layer has been developed. Further, an aspect ratio of the hole or the groove has been gradually increased. That is, deeper holes or grooves are formed in the etching target layer.

However, if depths of the holes or grooves formed in the etching target layer are increased, a mask made of silicon oxide is damaged by the etching, so that the mask cannot be maintained until the etching process is ended, or the etching process cannot be performed with the desired dimensional accuracy.

Under these circumstances, there has been demanded an etching method capable of maintaining a mask while a polycrystalline silicon layer is etched.

Means for Solving the Problems

In one example embodiment, a method of etching an etching target layer containing polycrystalline silicon includes preparing a target object including the etching target layer and a mask formed on the etching target layer; and etching the etching target layer with the mask. Further, the mask includes a first mask portion formed of polycrystalline silicon and a second mask portion interposed between the first mask portion and the etching target layer and formed of silicon oxide. Furthermore, in the etching of the etching target layer, a first gas for etching the etching target layer, a second gas for removing a deposit adhering to the mask, and a third gas for protecting the first mask portion are supplied into a processing vessel in which the target object is accommodated, and plasma of these gases is generated within the processing vessel.

In this method, the etching target layer as the polycrystalline silicon layer is etched with the mask including the first mask portion made of the polycrystalline silicon together with the second mask portion made of the silicon oxide. Further, when the etching target layer is etched, the first mask portion is protected with radicals generated from the third gas. Therefore, until etching of the etching target layer is ended, the mask can be maintained. Further, it is possible to supply the second gas for removing an etching by-product, i.e., the deposit, adhering to the mask. Consequently, it is possible to suppress the deposit from clogging the opening of the mask. Furthermore, a probability that the radicals generated from the third gas are adsorbed to the etching target layer, i.e., a bottom portion of a hole or groove, is lower than a probability that the radicals are adsorbed to the upper portion of the mask, i.e., the first mask portion. Thus, it is possible to etch the etching target layer while protecting the first mask portion.

In the example embodiment, the first gas may be a HBr gas, and the second gas may be a $NF_3$ gas. In the example embodiment, the etching by-product, i.e., $SiBr_4$, generated by etching the polycrystalline silicon layer with the HBr gas can be removed with the plasma of the $NF_3$ gas. Further, in the example embodiment, the third gas may be an oxygen gas ($O_2$ gas). Oxygen radicals generated from the oxygen gas may modify the polycrystalline silicon layer of the first mask portion to protect the first mask portion.

In the example embodiment, in the etching of the etching target layer, a flow rate of the second gas with respect to a flow rate of the first gas may be higher than a flow rate defined by a flow rate ratio of 20:3 between the first gas and the second gas, and a flow rate of the third gas may be lower than the flow rate of the second gas and also higher than ½ of the flow rate of the second gas. By controlling the gas flow rates as such, it is possible to more effectively suppress the opening of the mask from being clogged or a dimension of the opening from being changed while maintaining the mask.

In another example embodiment, there is provided a plasma processing apparatus in which the above-described method can be performed. The plasma processing apparatus includes a processing vessel; a gas supply unit; and a plasma generating unit. The gas supply unit is configured to supply a first gas for etching a polycrystalline silicon layer, a second gas for removing a deposit generated by etching polycrystalline silicon, and a third gas for protecting polycrystalline silicon into the processing vessel. The plasma generating unit is configured to generate plasma of the first gas, the second gas, and the third gas. With this plasma processing apparatus, it is possible to etch an etching target layer while maintaining the above-described mask.

In the example embodiment, the first gas may be a HBr gas, and the second gas may be a $NF_3$ gas. Further, in the example embodiment, the third gas may be an oxygen gas.

In the example embodiment, the plasma processing apparatus may further include a control unit configured to control flow rates of the first gas, the second gas, and the third gas. Further, the control unit may control the gas supply unit to set a flow rate of the second gas with respect to a flow rate of the first gas to be higher than a flow rate defined by a flow rate ratio of 20:3 between the first gas and the second gas and to set a flow rate of the third gas to be lower than the flow rate of the second gas and also higher than ½ of the flow rate of the second gas. By controlling the gas flow rates as such, it is possible to more effectively suppress the opening of the mask from being clogged or the dimension of the opening from being changed while maintaining the mask.

Effect of the Invention

As described above, in accordance with various aspects and example embodiments, there is provided an etching method capable of maintaining a mask. This method can maintain a mask even when etching a polycrystalline silicon layer having a high aspect ratio.

BRIEF DESCRIPTION OF THE DRAWINGS

FIG. 5 is a table showing processing conditions of experimental examples 1 to 6.

MODE FOR CARRYING OUT THE INVENTION

Figure 1:
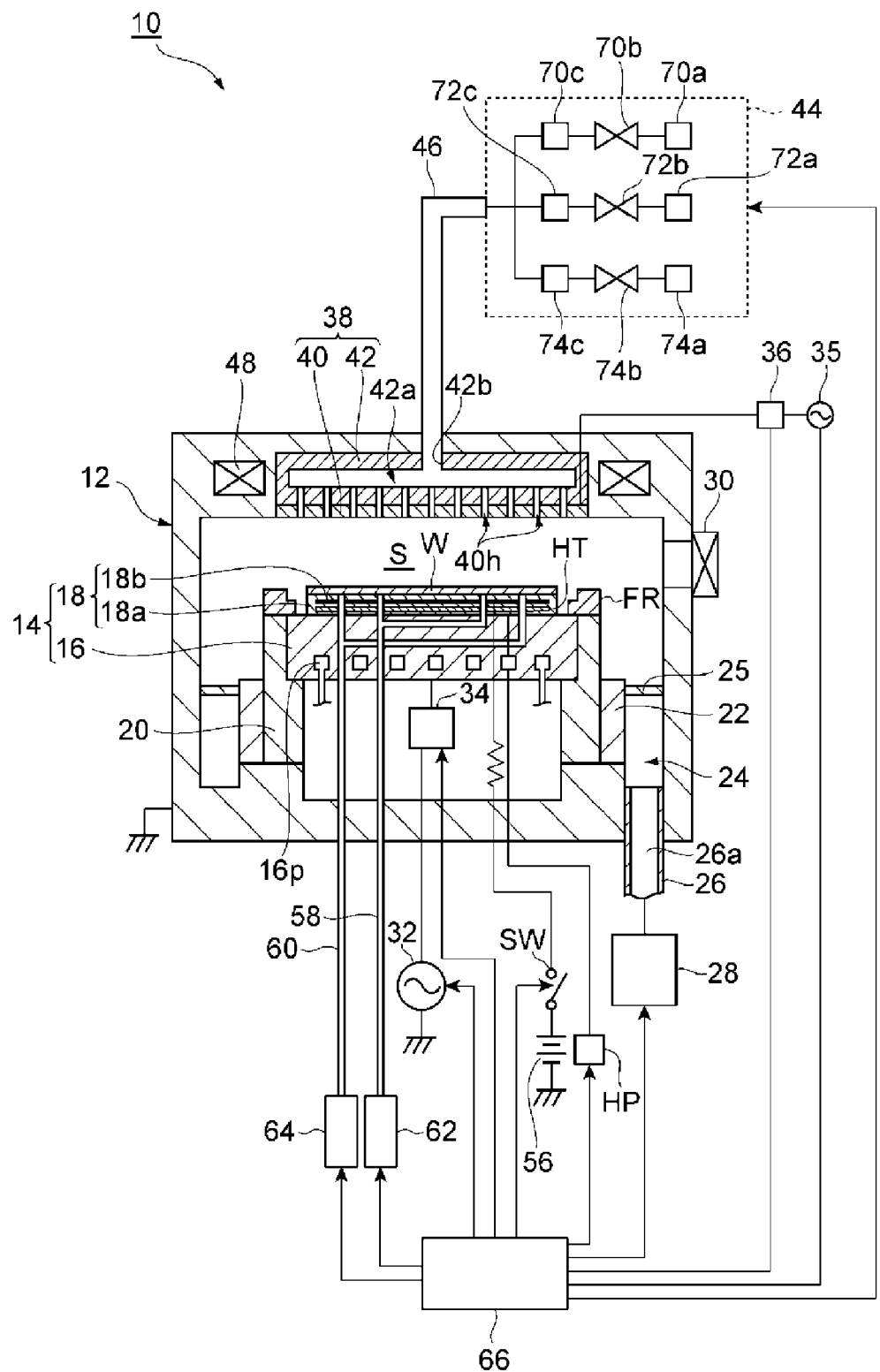
FIG. 1 is a diagram schematically showing a plasma processing apparatus in accordance with an example embodiment.

Hereinafter, various example embodiments will be explained with reference to the accompanying drawings. Further, in the drawings, the same reference numerals indicate the same or corresponding parts.

A plasma processing apparatus in accordance with an example embodiment will be explained first. FIG. 1 is a diagram schematically showing a plasma processing apparatus in accordance with the example embodiment. FIG. 1 illustrates a cross section view of the plasma processing apparatus in accordance with the example embodiment. The plasma processing apparatus 10 depicted in FIG. 1 is configured as a parallel plate type plasma processing apparatus.

The plasma processing apparatus 10 includes a processing vessel 12. The processing vessel 12 has a substantially cylindrical shape, and partitions therein a processing space S. At a side wall of the processing vessel 12, there is provided a gate valve 30 that opens and closes a loading/unloading opening for a target object (substrate) W. The plasma processing apparatus 10 includes a mounting table 14 within the processing vessel 12. The mounting table 14 is provided under the processing space S. The mounting table 14 includes a conductive base 16 and an electrostatic chuck 18. The base 16 has a substantially circular plate shape. The base 16 is made of, for example, aluminum and serves as a lower electrode.

The base 16 is electrically connected to a high frequency power supply 32 via a matching unit 34. The high frequency power supply 32 is configured to apply a high frequency power having a preset high frequency (for example, 2 MHz to 27 MHz) for ion attraction, i.e., a high frequency bias power, to the lower electrode, i.e., the base 16.

In the example embodiment, the base 16 may cool the electrostatic chuck 18 by absorbing heat of the electrostatic chuck 18. To be specific, a coolant path 16p is formed within the base 16, and the coolant path 16p may be connected to a coolant inlet line and a coolant outlet line. The mounting table 14 has a configuration in which the base 16 and the electrostatic chuck 18 can be controlled to have a preset temperature by circulating an appropriate coolant, for example, cooling water, through the coolant path 16p.

In the plasma processing apparatus 10, the electrostatic chuck 18 is provided on an upper surface of the base 16. The electrostatic chuck 18 has a substantially circular plate shape, and includes an insulating layer 18a and a power supply layer 18b. The insulating layer 18a is a film formed of an insulator such as ceramic, and the power supply layer 18b is a conductive film formed and serves as an inner layer of the insulating layer 18a. The power supply layer 18b is connected to a DC power supply 56 via a switch SW. If a DC voltage is applied to the power supply layer 18b from the DC power supply 56, a Coulomb force is generated, so that the target object W is adsorbed and held on the electrostatic chuck 18 by the Coulomb force.

In the example embodiment, a heater HT as a heating element is embedded within the electrostatic chuck 18. In this example embodiment, the electrostatic chuck 18 is configured to heat the target object W to a preset temperature with the heater HT. The heater HT is connected to a heater power supply HP via a wiring.

The plasma processing apparatus 10 may further include gas supply lines 58 and 60 and heat transfer gas supply units 62 and 64. The heat transfer gas supply unit 62 is connected to a gas supply line 58. This gas supply line 58 is extended to an upper surface of the electrostatic chuck 18 and annularly extended at a central portion of the upper surface thereof. The heat transfer gas supply unit 62 is configured to supply a heat transfer gas such as a He gas into a gap between the upper surface of the electrostatic chuck 18 and the target object W. Further, the heat transfer gas supply unit 64 is connected to the gas supply line 60. The gas supply line 60 is extended to the upper surface of the electrostatic chuck 18 and annularly extended at the upper surface thereof to surround the gas supply line 58. The heat transfer gas supply unit 64 is configured to supply a heat transfer gas such as a He gas into the gap between the upper surface of the electrostatic chuck 18 and the target object W.

The plasma processing apparatus 10 may further include a cylindrical holder 20 and a cylindrical supporting member 22. The cylindrical holder 20 is configured to hold the base 16 while being in contact with a side surface of the base 16 and an edge of a bottom surface of the base 16. The cylindrical supporting member 22 is vertically extended from a bottom portion of the processing vessel 12 and supports the base 16 via the cylindrical holder 20. The plasma processing apparatus 10 may further include a focus ring FR to be mounted on an upper surface of the cylindrical holder 20. The focus ring FR may be made of, for example, quartz.

In the example embodiment, an exhaust path 24 is formed between the side wall of the processing vessel 12 and the cylindrical supporting member 22. At an inlet or in the middle of the exhaust path 24, a baffle plate 25 is provided. Further, at a bottom portion of the exhaust path 24, an exhaust opening 26a is formed. The exhaust opening 26a is partitioned and formed by an exhaust pipe 26 inserted into the bottom portion of the processing vessel 12. The exhaust pipe 26 is connected to an exhaust device 28. The exhaust device 28 includes a vacuum pump and is configured to depressurize the processing space S within the processing vessel 12 to a preset vacuum level.

The plasma processing apparatus 10 further includes a shower head 38 within the processing vessel 12. The shower head 38 is provided above the processing space S. The shower head 38 includes an electrode plate 40 and an electrode supporting body 42.

The electrode plate 40 is a conductive plate having a substantially circular shape, and serves as an upper electrode. The electrode plate 40 includes multiple gas discharge holes 40h. The electrode plate 40 is detachably supported on the electrode supporting body 42. Within the electrode supporting body 42, a buffer room 42a is formed. The plasma processing apparatus 10 further includes a gas supply unit 44. A gas inlet opening 42b of the buffer room 42a is connected to the gas supply unit 44 via a gas supply line 46. The gas supply unit 44 is configured to supply a first gas, a second gas, and a third gas into the processing space S.

In the example embodiment, the gas supply unit 44 includes a gas source 70a, a valve 70b, a flow rate controller 70c, a gas source 72a, a valve 72b, a flow rate controller 72c, a gas source 74a, a valve 74b, and a flow rate controller 74c. The gas source 70a is a gas source of the first gas. The first gas is an etchant gas for an etching target layer, i.e., a polycrystalline silicon layer, to be etched in the plasma processing apparatus 10. In the example embodiment, the first gas is a HBr gas. The gas source 70a is connected to the gas supply pipe 46 via the valve 70b and the flow rate controller 70c such as a mass flow rate controller.

The gas source 72a is a gas source of the second gas. The second gas is a gas for removing a deposit generated by etching the polycrystalline silicon layer as the etching target layer. In the example embodiment, the second gas is a $NF_3$ gas. The gas source 72a is connected to the gas supply pipe 46 via the valve 72b and the flow rate controller 72c such as a mass flow rate controller. Further, the gas source 74a is a gas source of the third gas. The third gas is a gas for protecting polycrystalline silicon contained in a mask for etching the etching target layer. In the example embodiment, the third gas is an oxygen gas ($O_2$ gas). The gas source 74a is connected to the gas supply pipe 46 via the valve 74b and the flow rate controller 74c such as a mass flow rate controller.

In the electrode supporting body 42, multiple gas through holes respectively connected to the multiple gas discharge holes 40h are formed. The multiple gas through holes communicate with the buffer room 42a. Therefore, a gas supplied from the gas supply unit 44 is introduced into the processing space S through the buffer room 42a and the gas discharge holes 40h. Further, the shower head 38 and the gas supply unit 44 serve as a gas supply unit in accordance with the example embodiment.

Further, the electrode plate 40 is electrically connected to a high frequency power supply 35 via a matching unit 36. In accordance with the example embodiment, the high frequency power supply 35 is configured to apply a high frequency power having a preset frequency (for example, 27 MHz or more) for plasma generation to the electrode plate 40. While the high frequency power is applied to the electrode plate 40 from the high frequency power supply 35, a high frequency electric field is generated in a space, i.e., the processing space S, between the base 16 and the electrode plate 40, and the first gas, the second gas, and the third gas are excited into plasma. Therefore, in the present example embodiment, the base 16, the electrode plate 40, and the high frequency power supply 35 serve as a plasma generating unit.

In the example embodiment, there is provided a magnetic field forming device 48 annularly or concentrically extended at a ceiling portion of the processing vessel 12. The magnetic field forming device 48 allows high frequency electric discharge (plasma ignition) to be easily started in the processing space S, so that the electric discharge can be stably maintained.

Further, in the example embodiment, the plasma processing apparatus 10 may further include a control unit 66. The control unit 66 is connected to the exhaust device 28, the switch SW, the high frequency power supply 32, the matching unit 34, the high frequency power supply 35, the matching unit 36, the gas supply unit 44, the heat transfer gas supply units 62 and 64, and the heater power supply HP. The control unit 66 is configured to transmit a control signal to each of the exhaust device 28, the switch SW, the high frequency power supply 32, the matching unit 34, the high frequency power supply 35, the matching unit 36, the gas supply unit 44, the heat transfer gas supply units 62 and 64, and the heater power supply HP. By the control signals outputted from the control unit 66, exhaust by the exhaust device 28, opening and closing of the switch SW, power supply from the high frequency power supply 32, impedance control by the matching unit 34, power supply from the high frequency power supply 35, impedance control by the matching unit 36, supply of the first, second, and third gases by the gas supply unit 44 and flow rates thereof, supply of a heat transfer gas by each of the heat transfer gas supply units 62 and 64, and power supply from the heater power supply HP are controlled.

In the plasma processing apparatus 10, the first gas to the third gas are supplied from the gas supply unit 44 into the processing space S. Further, between the electrode plate 40 and the base 16, i.e., in the processing space S, a high frequency electric field is generated. Thus, plasma of the first gas is generated in the processing space S, and the etching target layer, i.e., the polycrystalline silicon layer, of the target object W is etched with Br ions or Br radicals. Further, plasma of the second gas is generated, and a deposit generated by etching the etching target layer is removed with F ions or F radicals. Furthermore, plasma of the third gas is generated, and the polycrystalline silicon of the mask for etching the etching target layer is protected with O (oxygen) radicals.

Figure 2:
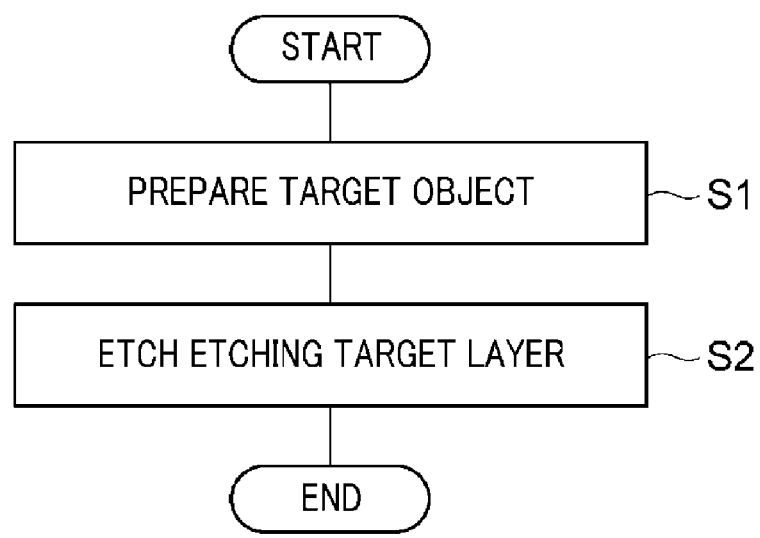
FIG. 2 is a flowchart showing an etching method in accordance with the example embodiment.

Hereinafter, an etching method which can be performed in the plasma processing apparatus 10 will be explained. FIG. 2 is a flowchart showing the etching method in accordance with the example embodiment. Further, FIG. 3A to FIG. 3E are cross-sectional views explaining details of the etching method shown in FIG. 2. In the etching method shown in FIG. 2, the target object W is prepared at a process S1. The target object W includes an etching target layer EL which is a polycrystalline silicon layer, and in the process S1, a mask M is formed on the etching target layer EL which is a polycrystalline silicon layer.

Figure 3A:
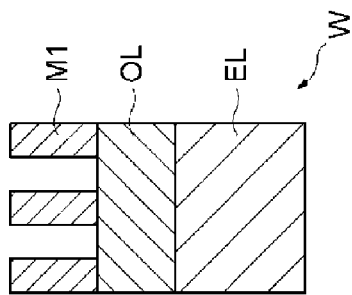
FIG. 3A to FIG. 3E are cross-sectional views explaining details of the etching method shown in FIG. 2.

To be specific, as depicted in FIG. 3A, a silicon oxide layer OL, for example, a $SiO_2$ layer, is formed on the etching target layer EL, and a polycrystalline silicon layer PL is formed on the silicon oxide layer OL. Then, a resist mask RM having a preset pattern is formed on the polycrystalline silicon layer PL. The silicon oxide layer OL and the polycrystalline silicon layer PL can be formed in, for example, a plasma CVD apparatus. Further, the resist mask RM can be formed using the photolithography technology.

Figure 3B:
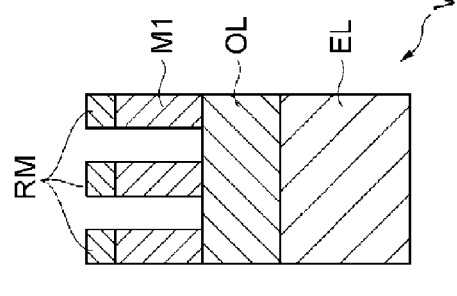
Figure 3C:
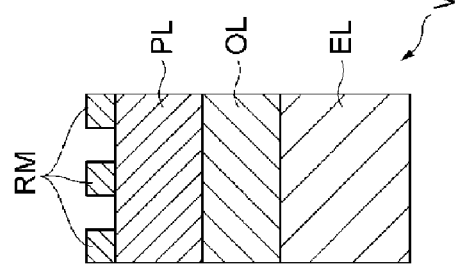

Then, as depicted in FIG. 3B, the polycrystalline silicon layer PL is etched. The polycrystalline silicon layer PL can be etched with a HBr gas as an etchant gas in the same plasma processing apparatus as the plasma processing apparatus 10. Thus, as depicted in FIG. 3B, the polycrystalline silicon layer PL is etched at a portion exposed through an opening of the resist mask RM. As a result, there is formed a first mask portion M1 which is a part of the mask M. Then, as depicted in FIG. 3C, the resist mask RM is removed.

Figure 3D:
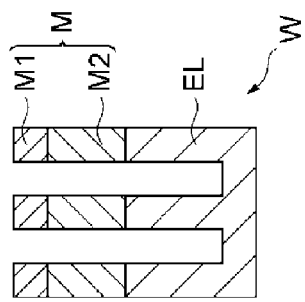

Then, as depicted in FIG. 3D, the silicon oxide layer OL is etched. The silicon oxide layer OL can be etched with a fluorocarbon-based gas, for example, a $CF_4$ gas, as an etchant gas in the same plasma processing apparatus as the plasma processing apparatus 10. Thus, as depicted in FIG. 3D, the silicon oxide layer OL is etched at a portion exposed through an opening of the first mask portion M1. As a result, there is formed a second mask portion M2 which is the other part of the mask M. Then, the mask M including the first mask portion M1 and the second mask portion M2 is formed on the etching target layer EL.

Figure 3E:
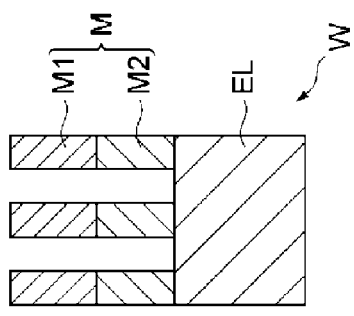

Referring to FIG. 2 again, in the present etching method, the target object W prepared in the process S1 is mounted and held on the electrostatic chuck 18 of the plasma processing apparatus 10. Then, in a process S2, as depicted in FIG. 3E, the etching target layer EL is etched. In the process S2, the etching target layer EL is etched at a portion exposed through an opening of the mask M.

In the process S2, in order to etch the etching target layer EL which is a polycrystalline silicon layer, the above-described first gas (HBr gas), second gas ($NF_3$ gas), and third gas ($O_2$ gas) are supplied into the processing vessel 12, and plasma of these gases is generated within the processing vessel 12.

Figure 4:
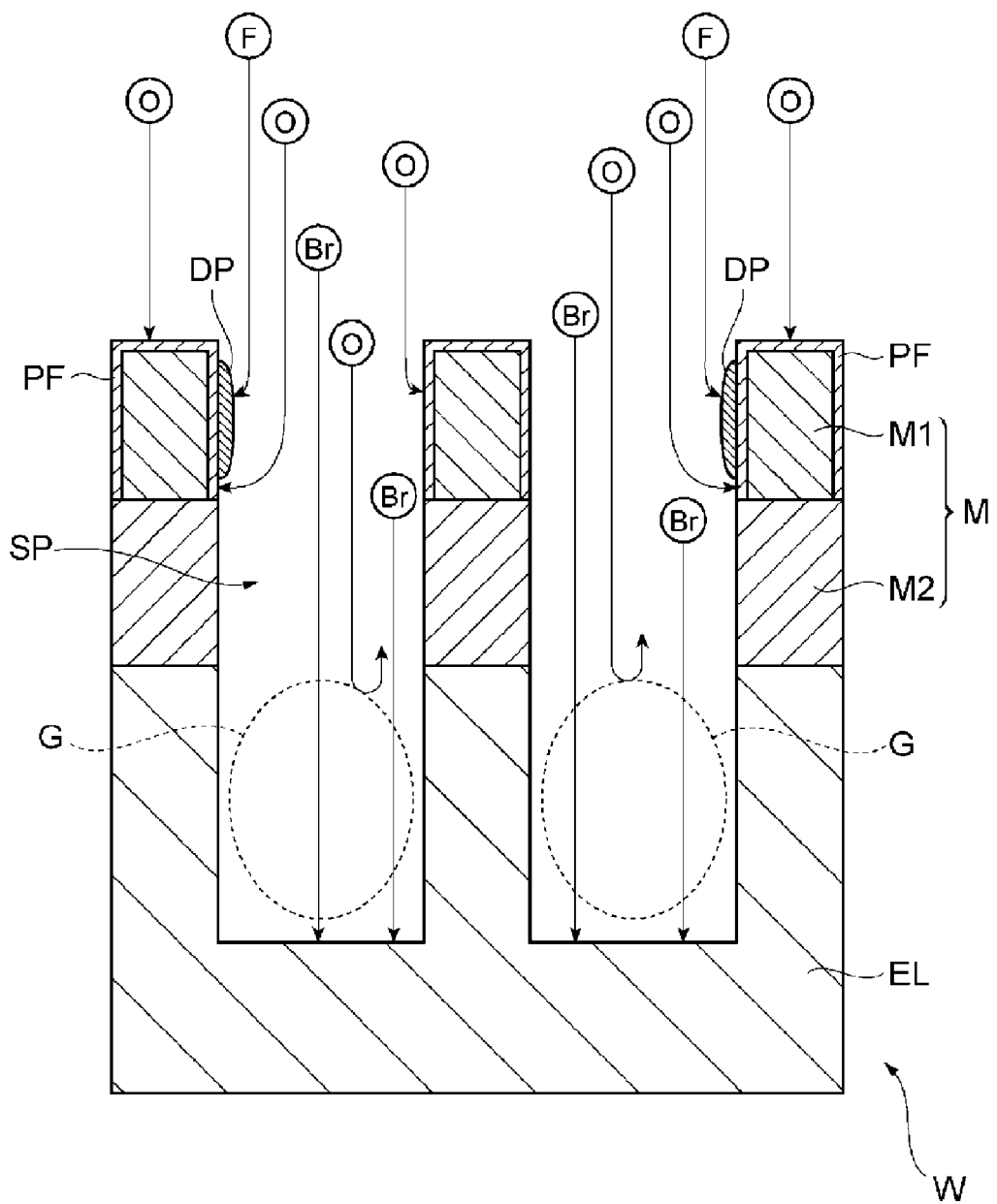
FIG. 4 is a diagram explaining a principle of the process S2 shown in FIG. 2.

Hereinafter, FIG. 4 will be referred to. FIG. 4 is a diagram explaining a principle of the process S2 shown in FIG. 2. In the process S2, the etching target layer EL is etched by a reaction expressed by the following chemical formula 1.

$$Si + 4HBr \rightarrow SiBr_4 + Others$$ [Chemical Formula 1]

Herein, the "others" in the chemical formula 1 include H ions or H radicals.

That is, in the process S2, Br ions or Br radicals generated by dissociation of the HBr gas react with the polycrystalline silicon of the etching target layer EL as depicted in FIG. 4 to etch the etching target layer EL. Further, in FIG. 4, the encircled "Br" denotes Br ions or Br radicals.

Further, in the process S2, the first mask portion M1 is protected through a reaction expressed by the following chemical formula 2.

$$Si + 2O^* \rightarrow SiO_2$$ [Chemical Formula 2]

That is, in the process S2, O radicals (O*) generated by dissociation of the $O_2$ gas react with polycrystalline silicon on a surface of the first mask portion M1 as depicted in FIG. 4 to form a protective film PF made of $SiO_2$. Further, in FIG. 4, the encircled "O" denotes O radicals.

Herein, as depicted in FIG. 4, the O radicals can reach an upper portion of the mask M, i.e., the first mask portion M1, without any interruption. Meanwhile, the etching target layer EL is located under a space SP partitioned and formed by the mask M, i.e., at a bottom portion of the groove or the hole partitioned and formed by the mask M. In the space SP, a volatile gas G, for example, a $SiBr_4$ gas, generated by etching the etching target layer EL may stay. Therefore, a probability that the electrically neutral O radicals reach the etching target layer EL is considerably lower than a probability that the O radicals reach the first mask portion M1. Further, the Br ions can be attracted to the etching target layer EL by applying the high frequency bias power to the lower electrode 16. By this principle, it is assumed that in the present etching method, it is possible to maintain the mask M until the etching process is ended by protecting the first mask portion M1 while the etching target layer EL is etched.

Further, in the process S2, an etching by-product as a deposit DP may be adsorbed to the mask M. The deposit DP may reduce a width of the opening partitioned and formed by the mask M or may clog the opening of the mask M. The deposit DP may be formed of, for example, $SiBr_4$. Therefore, in the present etching method, the deposit DP is removed by a reaction expressed by the following chemical formula 3 by supplying the $NF_3$ gas in the process S2.

$$SiBr_4 + xF \rightarrow SiF_xBr_{(4-x)}$$ [Chemical Formula 3]

Herein, the "x" is an integer of 1 or more and 3 or less.

To be more specific, in the process S2, fluorine ions or fluorine radicals generated by dissociation of the $NF_3$ gas react with $SiBr_4$ of the deposit DP as depicted in FIG. 4 to produce $SiF_xBr_{(4-x)}$, and then, the deposit is removed by exhausting the $SiF_xBr_{(4-x)}$. As a result, in the present etching method, it is possible to suppress the opening of the mask M from being clogged, or possible to suppress a change in a width of the opening of the mask M. Further, in FIG. 4, the encircled "F" denotes F ions or F radicals.

In the example embodiment, in the process S2, a flow rate of the $NF_3$ gas with respect to a flow rate of the HBr gas may be higher than a flow rate defined by a flow rate ratio of 20:3 between the HBr and the $NF_3$ gas, and a flow rate of the $O_2$ gas may be lower than the flow rate of the $NF_3$ gas and higher than ½ of the flow rate of the $NF_3$ gas. The flow rate of the HBr gas, the flow rate of the $NF_3$ gas, and the flow rate of the $O_2$ gas can be adjusted by, for example, controlling the flow rate controllers 70c, 72c, and 74c through the control unit 66. By supplying the HBr gas, the $NF_3$ gas, and the $O_2$ gas as such, it is possible to effectively remove the deposit DP and thus possible to suppress the opening of the mask from being clogged. Further, it is possible to reduce a change in the dimension of the opening of the mask M. Furthermore, by suppressing excessive supply of the oxygen radicals, it is possible to protect the mask M and also possible to effectively etch the etching target layer EL.

Hereinafter, there will be explained experimental examples 1 to 6 of the above-described etching method performed in the plasma processing apparatus 10. FIG. 5 is a table showing processing conditions of the experimental examples 1 to 6. In the experimental examples 1 to 6, as shown in the table of FIG. 5, a pressure within the processing vessel is set to be 10.6 Pa (80 mTorr), the high frequency power (HF power) from the high frequency power supply 35 is set to be 400 W, the high frequency power (LF power) from the high frequency power supply 32 is set to be 950 W, and a flow rate of the HBr gas is set to be 200 sccm. Further, in the experimental examples 1 to 6, as shown in the table of FIG. 5, an etching process is performed for 146 seconds with different flow rates of the $NF_3$ gas and the $O_2$ gas. Furthermore, in the experimental examples 1 to 6, a frequency of the high frequency power (HF power) from the high frequency power supply 35 is set to be 100 MHz, and a frequency of the high frequency power (LF power) from the high frequency power supply 32 is set to be 3.2 MHz. Moreover, in the experimental examples 1 to 6, the etching target layer EL as a polycrystalline silicon layer is etched with the mask M which has an opening width of 40 nm and includes the first mask portion M1 having a thickness of 300 nm and the second mask portion M2 having a thickness of 1000 nm.

Figure 6:
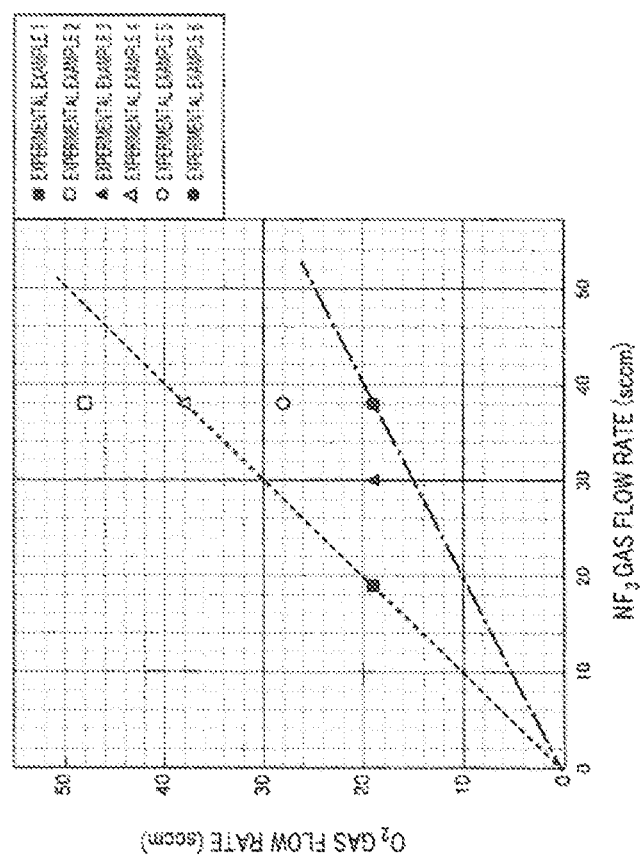
FIG. 6 is a graph mapping flow rates of a $NF_3$ gas and flow rates of an $O_2$ gas in the experimental examples 1 to 6.

FIG. 6 is a graph mapping flow rates of the $NF_3$ gas and flow rates of the $O_2$ gas of the experimental examples 1 to 6.

Hereinafter, results of the experimental examples 1 to 6 will be discussed with reference to FIG. 6. The processing conditions of the experimental examples 1, 3, and 6 are different in the flow rate of the $NF_3$ gas. In the experimental examples 1 and 3, the flow rate of the $NF_3$ gas is not sufficient with respect to the flow rate of the HBr gas, so that the deposit DP is not fully removed from the mask M. As a result, the dimension of the opening of the mask M is reduced, and a dimension of the profile formed on the etching target layer EL becomes smaller than a preset dimension. Meanwhile, in the experimental example 6, the deposit DP can be removed from the mask M. Therefore, desirably, the flow rate of the $NF_3$ gas with respect to the flow rate of the HBr gas is higher than the flow rate defined by the flow rate ratio of 20:3 between the HBr gas and the $NF_3$ gas. However, in the experimental example 6, since the mask M is not sufficiently protected, the mask M is greatly etched.

The processing conditions of the experimental examples 2, 4, 5, and 6 are different in the flow rate of the $O_2$ gas. In the experimental example 6, O radicals are not sufficient, so that an etched amount of the mask M is increased as described above. In the experimental example 5 where the flow rate of the $O_2$ gas is increased as compared with the experimental example 6, the mask M is protected with O radicals, so that an etched amount of the mask M is small. Further, in the experimental example 5, the deposit DP is removed from the mask M and the change in the dimension of the mask M is suppressed. As a result, the dimension of the profile formed on the etching target layer EL has the preset dimension. In the experimental examples 2 and 4 where the flow rate of the $O_2$ gas is increased as compared with the experimental example 5, the protective film PF formed of O radicals becomes thick. As a result, the dimension of the opening of the mask M is reduced, so that the dimension of the profile formed on the etching target layer EL becomes smaller than the preset dimension. From this result, desirably, the flow rate of the $O_2$ gas is lower than the flow rate of the $NF_3$ gas and higher than ½ of the flow rate of the $NF_3$ gas. That is, desirably, the flow rate of the $NF_3$ gas and the flow rate of the $O_2$ gas are within the ranges respectively enclosed by the dotted line and the dashed dotted line of FIG. 6. Further, the dotted line of FIG. 6 indicates that a ratio of the flow rate of the $NF_3$ gas and the flow rate of the $O_2$ gas is 1:1, and the dashed dotted line of FIG. 6 indicates that a ratio of the flow rate of the $NF_3$ gas and the flow rate of the $O_2$ gas is 2:1.

Further, as a comparative example, an etching target layer made of polycrystalline silicon including thereon a mask which is the same as the second mask portion formed of a silicon oxide layer of 1000 nm is etched in the same manner under the same conditions as the experimental example 5 except that the second gas and the third gas are not supplied. As a result, a thickness of the mask of the experimental example 5 at the time of ending the etching process is greater by 290 nm than a thickness of the mask of the comparative example at the time of ending the etching process. Therefore, in the experimental example 5, the mask can be maintained at a great thickness until the etching process is ended.

The various example embodiments have been explained above, but the present disclosure is not limited to the above-described example embodiments and can be modified and changed in various ways. By way of example, as the second gas, a $SF_6$ gas, a $SiF_4$ gas, a $C_4F_8$ gas, or a $CF_4$ gas can be used instead of the $NF_3$ gas. Further, as the third gas, a mixture of an $O_2$ gas and a $N_2$ gas, or a $N_2$ gas can be used instead of the $O_2$ gas.

The plasma processing apparatus 10 is a parallel plate type plasma processing apparatus, but various plasma processing apparatuses such as an inductively coupled plasma processing apparatus, a plasma processing apparatus using a microwave as a plasma source, or the like can be applied to the present disclosure.

EXPLANATION OF REFERENCE NUMERALS

10: Plasma processing apparatus
12: Processing vessel
14: Mounting table
16: Base (Lower electrode)
18: Electrostatic chuck
28: Exhaust device
32: High frequency power supply (High frequency bias)
35: High frequency power supply (Plasma generation)
38: Shower head
40: Electrode plate
44: Gas supply unit
66: Control unit
W: Target object
EL: Etching target layer
M: Mask
M1: First mask portion
M2: Second mask portion
PF: Protective film
DP: Deposit
G: Volatile gas

I claim:

1. A method of etching an etching target layer containing polycrystalline silicon, the method comprising:
   preparing a target object including the etching target layer and a mask formed on the etching target layer, the mask including a first mask portion formed of polycrystalline silicon and a second mask portion interposed between the first mask portion and the etching target layer and formed of silicon oxide;
   supplying a first gas for etching the etching target layer, a second gas for removing a deposit adhering to the mask, and a third gas for protecting the first mask portion into a processing vessel in which the target object is accommodated;
   generating a plasma of the first, second and third gases within the processing vessel;
   forming a protective film on an upper surface and a side surface of the first mask portion by reacting O radicals generated by dissociation of the third gas with polycrystalline silicon on the upper and the side surfaces of the first mask portion; and
   etching the etching target layer with the mask,
   wherein the first mask portion and the second mask portion are in direct contact with each other, and
   an upper side of the first mask portion is exposed to the plasma.

2. The method of claim 1,
   wherein the first gas is a HBr gas.

3. The method of claim 2,
   wherein the second gas is a $NF_3$ gas.

4. The method of claim 2,
   wherein the third gas is an oxygen gas.

5. The method of claim 1,
   wherein the second gas is a $NF_3$ gas and the third gas is an oxygen gas, and
   in the etching of the etching target layer, a flow rate of the second gas with respect to a flow rate of the first gas is higher than a flow rate defined by a flow rate ratio of 20:3 between the first gas and the second gas, and a flow rate of the third gas is lower than the flow rate of the second gas and also higher than ½ of the flow rate of the second gas.

* * * * *